(12) United States Patent
Chu

(10) Patent No.: US 10,535,478 B1
(45) Date of Patent: Jan. 14, 2020

(54) PUSH-TYPE ROTARY SWITCH WITH DISPLAY FUNCTION

(71) Applicant: Ching-Hsiung Chu, New Taipei (TW)

(72) Inventor: Ching-Hsiung Chu, New Taipei (TW)

(73) Assignee: Ching-Hsiung Chu, New Taipei (TW)

( * ) Notice: Subject to any disclaimer, the term of this patent is extended or adjusted under 35 U.S.C. 154(b) by 0 days.

(21) Appl. No.: 16/186,494

(22) Filed: Nov. 10, 2018

(30) Foreign Application Priority Data

Oct. 12, 2018 (TW) .............................. 107135910 A

(51) Int. Cl.
| | | |
|---|---|---|
| *H01H 19/14* | (2006.01) | |
| *H01H 19/54* | (2006.01) | |
| *H01H 25/06* | (2006.01) | |

(52) U.S. Cl.
CPC ............ *H01H 19/14* (2013.01); *H01H 19/54* (2013.01); *H01H 25/06* (2013.01); *H01H 2219/00* (2013.01)

(58) Field of Classification Search
CPC ........ H01H 19/14; H01H 25/06; H01H 19/54; H01H 2219/00

USPC .............................................................. 200/4
See application file for complete search history.

(56) References Cited

U.S. PATENT DOCUMENTS

| | | | |
|---|---|---|---|
| 9,685,284 B1* | 6/2017 | Chu ........................ | H01H 9/161 |
| 2013/0220779 A1* | 8/2013 | Kerner ................... | H01H 19/11 |
| | | | 200/4 |

* cited by examiner

*Primary Examiner* — Edwin A. Leon
*Assistant Examiner* — Lheiren Mae A Caroc

(57) ABSTRACT

The present invention provides a push-type rotary switch having display function, comprising: a bearing seat having a signal producing unit and an IR interruption sensing signal producing unit, and a first signal being produced when pressing the signal producing unit, when a space between the IR reception end and the IR emission end is not interrupted, the circuit base emits a second signal; a rotating seat rotatably setting on the bearing seat, the signal producing unit being optionally pressed on the rotating seat; a key cap covering with the rotating seat, when the key cap is pushed, the key cap further presses the rotating seat, when the key cap is forced to rotate, the rotating seat correspondingly rotates, and the space between the IR reception end and the IR emission end is optionally interrupted when the key cap rotates; and a display being correspondingly set under the transparent wall.

2 Claims, 5 Drawing Sheets

PUSH-TYPE ROTARY SWITCH WITH DISPLAY FUNCTION

FIELD OF INVENTION

The present invention relates to a push-type rotary function with display function. In particular, it relates to a switch having display information, push and rotary mode which respectively produce independent control signal.

BACKGROUND OF THE INVENTION

In various types of electronic products, there are many control button switches for producing signal to perform turn-on and control function. There are many different types, sizes, and standards of switches in wide application.

The switch used in a precision equipment, small equipment, and small electric appliance is a form of switch button by only pushing or rotating. There are few advantages in the application of switch button by only pushing or rotating respectively, but a switch button by only pushing or rotating usually only output one signal. This application and functions are limited.

As for conventional push switches or rotary switches, which do not have display function, an indicator or tag printed on the switches is used as directions for use, thereby using for only single function. If a user hopes that this type of switch can achieve multiple control functions, this is impossible. This is current bottleneck.

To sum up, the inventor designed a push-type rotary switch with display function to improve aforementioned disadvantages and enhance industrial application.

The above information disclosed in this section is only for enhancement of understanding of the background of the described technology and therefore it may contain information that does not form the prior art that is already known to a person of ordinary skill in the art.

SUMMARY OF THE INVENTION

In order to improve the disadvantages of conventional technology, the present invention provides a push-type rotary switch having display function having novelty and non-obviousness, and expects to overcome the downside of conventional technology.

In order to achieve the aforementioned purpose, the present invention provides a push-type rotary switch having display function, comprising: the bearing seat having a circuit base fixed on a bottom wall of the bearing seat, and at least one signal producing unit and at least one IR interruption sensing signal producing unit setting on the circuit base, wherein the signal producing unit is electrically connected with the circuit base, and a pressing portion is set on the signal producing unit, when the pressing portion is pressed, the circuit base emits a first signal, wherein IR interruption sensing signal producing unit is electrically connected with the circuit base, and an IR reception end and an IR emission end are separated and included in the IR interruption sensing signal producing unit, when a space between the IR reception end and the IR emission end is not interrupted, the circuit base emits a second signal; a rotating seat vertically and rotatably setting on the bearing seat, wherein an outside wall of the rotating seat is round-shaped, a middle of the rotating seat is empty, and a pushing portion corresponding to the pressing portion of the signal producing unit is set on the rotating seat; and a key cap corresponding to and covering with the rotating seat, when the key cap is pressed, the key cap moves forward to press the rotating seat, and when the key cap is forced to rotate, the rotating seat correspondingly rotates, wherein the key cap further comprises an inner ring and an outside cap, the inner ring is a hollow and circle tube correspondingly slipping on an outside of the rotating seat, a lower wall of the inner ring further enters into the space between the IR reception end and the IR emission end, and a plurality of hollow portions are annularly distributed at the lower wall of the inner ring, when the key cap is forced to rotate and drives the rotating seat to rotate, the lower wall of the inner ring rotates at the space between the IR reception end and the IR emission end, the space between the IR reception end and the IR emission end is not intermittently interrupted, wherein the outside cap is correspondingly fixed at an outside of the inner ring, and a transparent wall is set on a top of the outside cap; and a display being correspondingly set under the transparent wall.

In the embodiment of the present invention, at least one flexible pusher is set on the outside wall of the rotating seat, a plurality of lugs are set around an inner wall of the inner ring, each lug is distributed in an included angle and corresponds to the flexible pusher, when the key cap is forced to rotate and drives the rotating seat to rotate, the plurality of lugs rotate through the flexible pusher and a resistance feedback is produced.

The push-type rotary switch with display function disclosed in the present invention provides two types output signal including push and rotation, and also has display function on a control button. It enhances operation functionality and flexibility. For example, when the present invention is used in a car, a user is able to push or presses it to turn on (or turn off) air conditioning, audio system, broadcast system, and so on. Subsequently, the user is able to control temperature of air conditioning, adjust volume of audio system, choose broadcast station from broadcast system, and so on by rotating it. Furthermore, the display is capable of showing the related information. It can be seen that many control interfaces can be assembled in the present invention, and a lot of space can be reduced in the car. The present invention, which compared with conventional technology, is non-obvious and not easily achieved.

Many of the attendant features and advantages of the present invention will become better understood with reference to the following detailed description considered in connection with the accompanying drawings.

BRIEF DESCRIPTION OF THE DRAWINGS

The detailed structure, operating principle and effects of the present invention will now be described in more details hereinafter with reference to the accompanying drawings that show various embodiments of the present invention as follows.

DETAILED DESCRIPTION OF THE PREFERRED EMBODIMENTS

Figure 1:
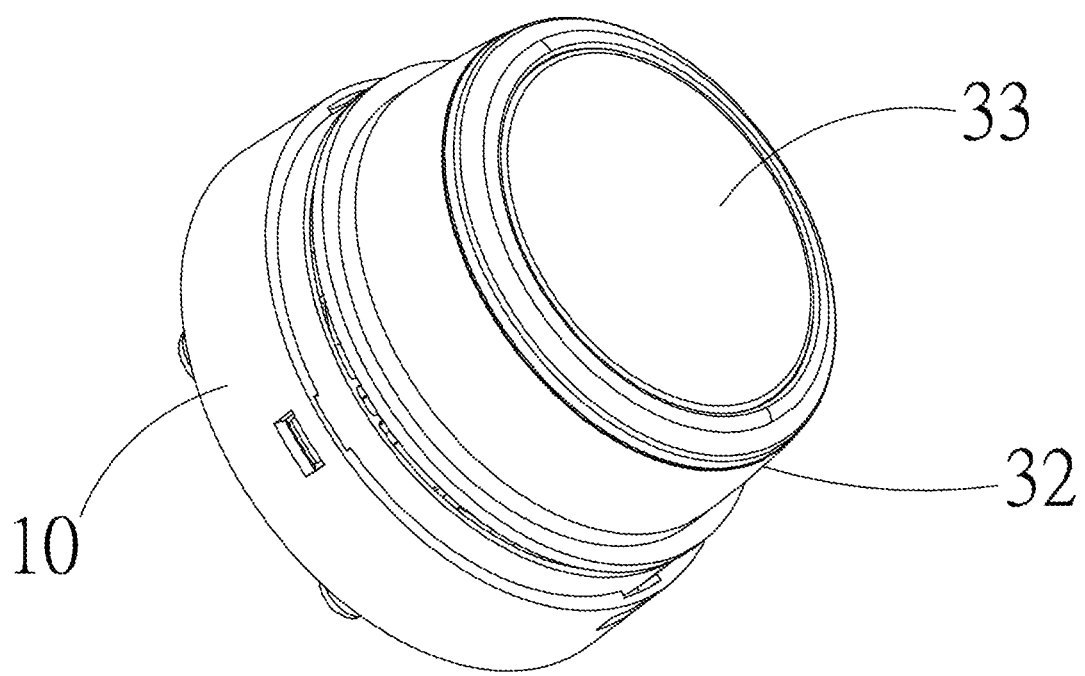
FIG. 1 is a schematic diagram of a push-type rotary switch with display function in the present invention.

Reference will now be made in detail to the exemplary embodiments of the present invention, examples of which are illustrated in the accompanying drawings. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. These embodiments are provided so that this invention will be thorough and complete, and will fully convey the inventive concept to those skilled in the art. The relative proportions and ratios of elements in the drawings may be exaggerated or diminished in size for the sake of clarity and convenience in the drawings, and such arbitrary proportions are only illustrative and not limiting in any way.

For convenience, certain terms employed in the specification, examples and appended claims are collected here. Unless defined otherwise, all technical and scientific terms used herein have the same meaning as commonly understood by one of the ordinary skill in the art to which this invention belongs.

Various embodiments will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments.

The singular forms "a", "and", and "the" are used herein to include plural referents unless the context clearly dictates otherwise.

Figure 2:
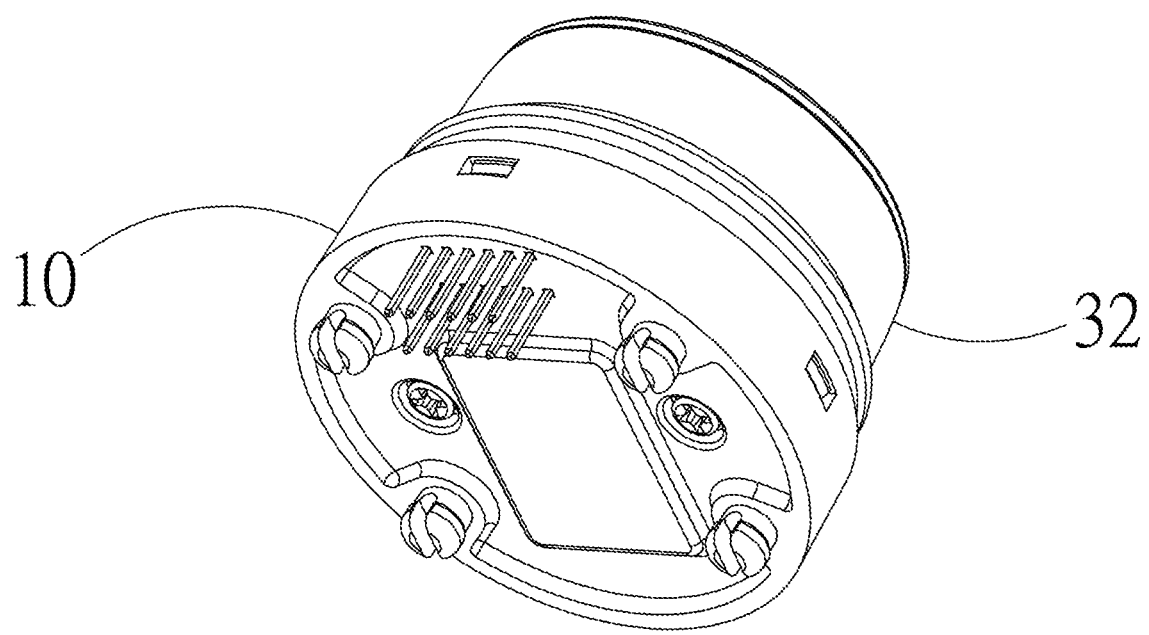
FIG. 2 is a schematic diagram in another viewing angle of the push-type rotary switch with display function in the present invention.
Figure 3:
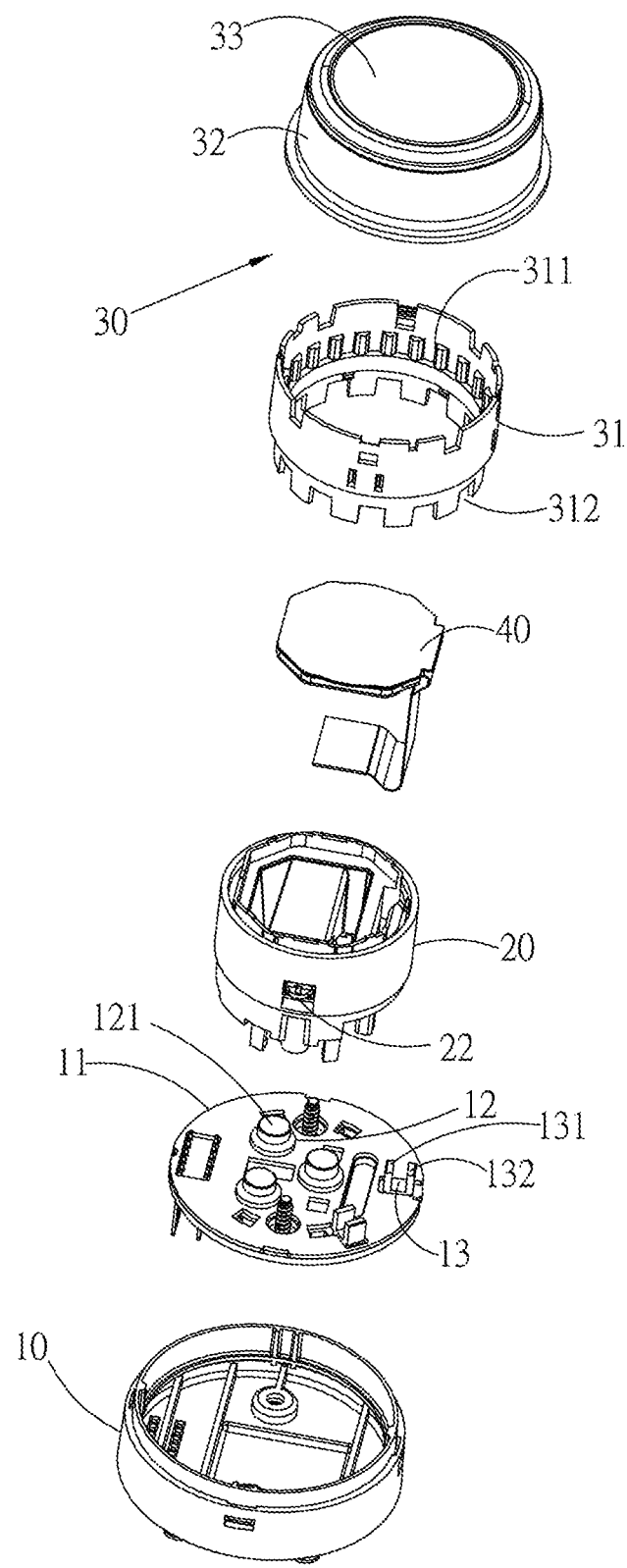
FIG. 3 is an exploded diagram of the push-type rotary switch with display function in the present invention.
Figure 4:
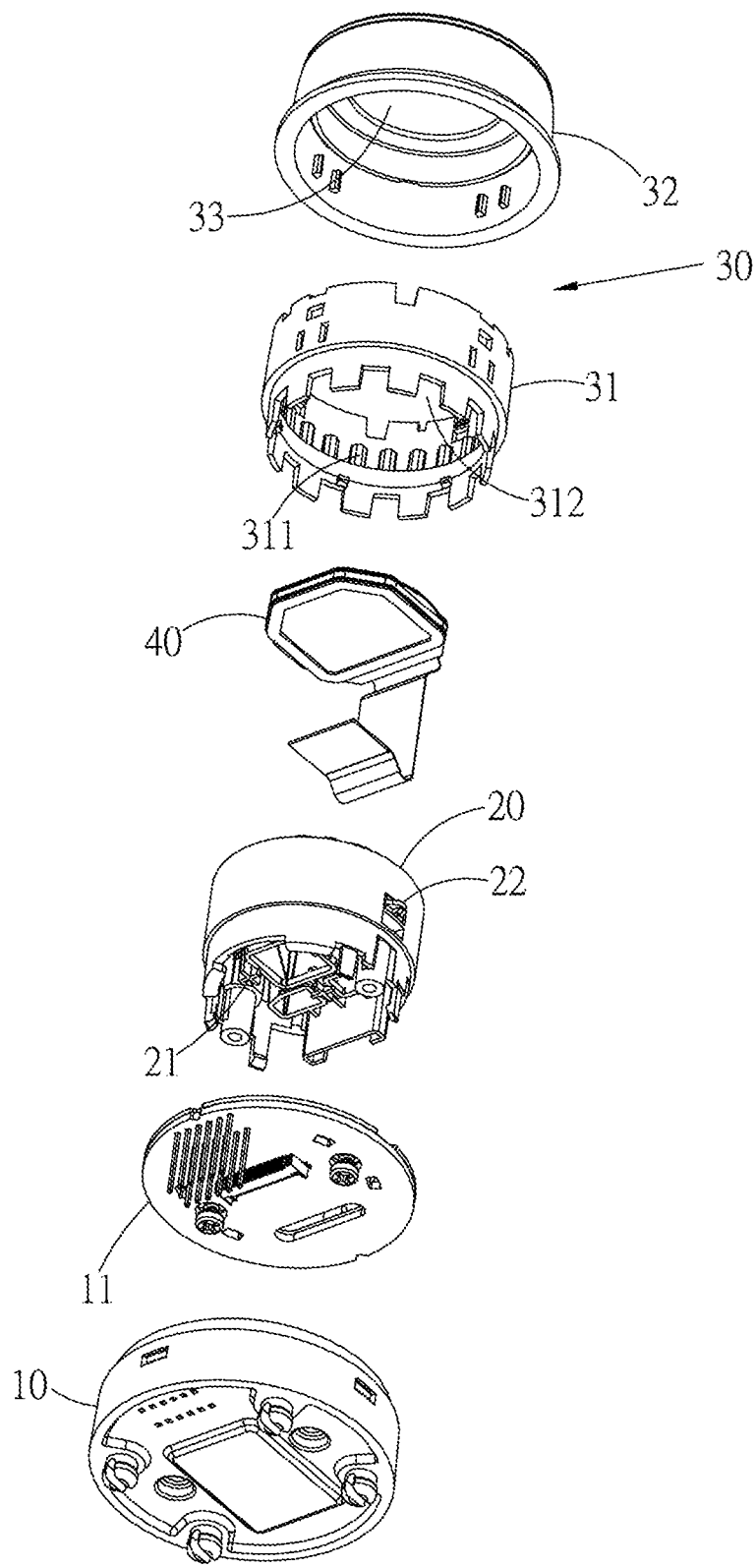
FIG. 4 is an exploded diagram in another viewing angle of the push-type rotary switch with display function in the present invention.
Figure 5:
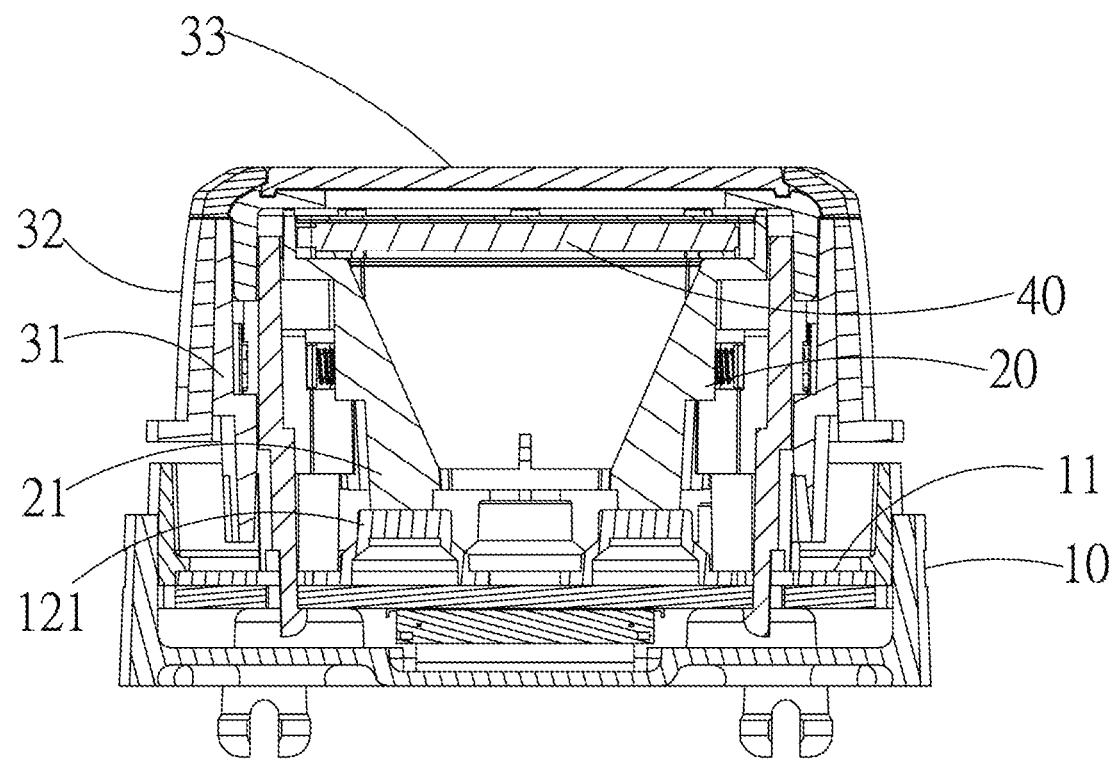
FIG. 5 is a sectional diagram of the push-type rotary switch with display function in the present invention.

Please refer to FIGS. 1~5, the present invention provides a push-type rotary switch with display function, comprising a bearing seat 10, a rotating seat 20, a key cap 30, and a display 40.

The bearing seat 10 is a housing having an opening on a top side, and the bearing seat 10 has a circuit base 11 fixed on a bottom wall of the bearing seat 10. At least one signal producing unit 12 and at least one IR (infrared) interruption sensing signal producing unit 13 are set on the circuit base 11. The signal producing unit 12 is electrically connected with the circuit base 11, and a pressing portion 121 is set on the signal producing unit 12. When the pressing portion 121 is pressed by a force, the circuit base 11 emits a first signal. The IR interruption sensing signal producing unit 13 is electrically connected with the circuit base 11, and an IR reception end 131 and an IR emission end 132 are separated and included in the IR interruption sensing signal producing unit 13. When a space between the IR reception end 131 and the IR emission end 132 is not interrupted, the circuit base 11 emits a second signal.

The rotating seat 20 corresponds to and is capable of going through an opening of the bearing seat 10, and enters into the bearing seat 10. The rotating seat 20 is vertically and rotatably set on the bearing seat 10, and an outside wall of the rotating seat 20 is round-shaped. The middle of rotating seat 20 is empty, and a pushing portion 21 corresponding to the pressing portion 121 of the signal producing unit 12 is set on the rotating seat 20. When the rotating seat 20 is forced to move, the pushing portion 21 pushes the pressing portion 121. Furthermore, at least one flexible pusher 22 is set on the outside wall of the rotating seat 20.

The key cap 30 corresponds to and covers with the rotating seat 20. When the key cap 30 is pressed by a force, the key cap 30 moves forward to press the rotating seat 20. When the key cap 30 is forced to rotate, the rotating seat 20 correspondingly rotates.

The key cap 30 further comprises an inner ring 31 and an outside cap 32, wherein the inner ring 31 is a hollow and circle tube correspondingly slipping on an outside of rotating seat 20, and a plurality of lugs 311 are set around an inner wall of the inner ring 31. Each lug 311 is distributed in an included angle and corresponds to the flexible pusher 22. When the key cap 30 is forced to rotate and drives the rotating seat 20 to rotate, the plurality of lugs 311 rotate through the flexible pusher 22 and a resistance feedback is produced. The plurality of lugs 311 are intermittently encountered the resistance feedback by flexible pusher 22 when the key cap 30 is rotated. A lower wall of the inner ring 31 further enters into the space between the IR reception end 131 and the IR emission end 132. A plurality of hollow portions 312 are annularly distributed at the lower wall of inner ring 31. When the lower wall of inner ring 31 rotates at the space between the IR reception end 131 and the IR emission end 132, the space between the IR reception end 131 and the IR emission end 132 is not intermittently interrupted because of the hollow portion 312.

The outside cap 32 is correspondingly fixed at an outside of inner ring 31, and a transparent wall 33 is set on a top of outside cap 32.

The display 40 is correspondingly set under the transparent wall 33, and is electrically connected with the circuit base 11.

The push-type rotary switch with display function disclosed in the present invention provides two types output signal including push and rotation, and also has display function on a control button. It enhances operation functionality and flexibility. For example, when the present invention is used in a car, a user is able to push or press it to turn on (or turn off) air conditioning, audio system, broadcast system, and so on. Subsequently, the user is able to control temperature of air conditioning, adjust volume of audio system, choose broadcast station from broadcast system, and so on by rotating it. Furthermore, the display is capable of showing the related information. It can be seen that the many control interfaces can be assembled in the present invention, and a lot of space can be reduced in the car. The present invention, which compared with conventional technology, is non-obvious and not easily achieved.

It will be understood that the above description of embodiments is given by way of example only and that various modifications may be made by those with ordinary skill in the art. The above specification, examples, and data provide a complete description of the present invention and use of exemplary embodiments of the invention. Although various embodiments of the invention have been described above with a certain degree of particularity, or with reference to one or more individual embodiments, those with ordinary skill in the art could make numerous alterations or modifications to the disclosed embodiments without departing from the spirit or scope of this invention.

What is claimed is:

1. A push-type rotary switch having display function, comprising:

a bearing seat, being a housing having an opening on a top side, the bearing seat having a circuit base fixed on a bottom wall of the bearing seat, and at least one signal producing unit and at least one IR interruption sensing signal producing unit set on the circuit base, wherein the signal producing unit is electrically connected with the circuit base, and a pressing portion is set on the signal producing unit, wherein when the pressing portion is pressed, the circuit base emits a first signal, wherein the IR interruption sensing signal producing unit is electrically connected with the circuit base, and an IR reception end and an IR emission end are separated and included in the IR interruption sensing signal producing unit, wherein when a space between the IR reception end and the IR emission end is not interrupted, the circuit base emits a second signal;

a rotating seat, vertically and rotatably set on the bearing seat, wherein an outside wall of the rotating seat is round-shaped, a middle of the rotating seat is empty, and a pushing portion corresponding to the pressing portion of the signal producing unit is set on the rotating seat;

a key cap, corresponding to and covering with the rotating seat, wherein when the key cap is pressed, the key cap moves forward to press the rotating seat, and when the key cap is forced to rotate, the rotating seat correspondingly rotates, wherein the key cap further comprises an inner ring and an outside cap, the inner ring is a hollow and circle tube correspondingly slipping on an outside of the rotating seat, a lower wall of the inner ring enters into the space between the IR reception end and the IR emission end, and a plurality of hollow portions are annularly distributed in the lower wall of the inner ring, wherein when the key cap is forced to rotate and drive the rotating seat to rotate, the lower wall of the inner ring rotates at the space between the IR reception end and the IR emission end, the space between the IR reception end and the IR emission end is not intermittently interrupted, wherein the outside cap is correspondingly fixed at an outside of the inner ring, and a transparent wall is set on a top of the outside cap; and a display, set under the transparent wall.

2. The push-type rotary switch having display function as defined in claim 1, wherein at least one flexible pusher is set on the outside wall of the rotating seat, a plurality of lugs are set around an inner wall of the inner ring, each lug is distributed in an included angle and corresponds to the flexible pusher, when the key cap is forced to rotate and drives the rotating seat to rotate, the plurality of lugs rotate through the flexible pusher and a resistance feedback is produced.

* * * * *